United States Patent
Kojima et al.

(10) Patent No.: US 10,938,342 B2
(45) Date of Patent: Mar. 2, 2021

(54) PROBE AND SOLAR BATTERY CELL MEASUREMENT APPARATUS

(71) Applicant: KYOSHIN ELECTRIC CO., LTD., Kyoto (JP)

(72) Inventors: Hisashi Kojima, Kyoto (JP); Yuji Nakamichi, Otsu (JP)

(73) Assignee: KYOSHIN ELECTRIC CO., LTD., Kyoto (JP)

( * ) Notice: Subject to any disclaimer, the term of this patent is extended or adjusted under 35 U.S.C. 154(b) by 48 days.

(21) Appl. No.: 16/217,662

(22) Filed: Dec. 12, 2018

(65) Prior Publication Data

US 2019/0334476 A1    Oct. 31, 2019

(30) Foreign Application Priority Data

Apr. 25, 2018    (JP) .............................. JP2018-083676

(51) Int. Cl.
*H02S 50/10*    (2014.01)
*G01R 31/36*    (2020.01)

(52) U.S. Cl.
CPC .......... *H02S 50/10* (2014.12); *G01R 31/3644* (2013.01)

(58) Field of Classification Search
CPC ..... H02S 50/10; H02S 40/34; G01R 31/6344; G01R 1/07342; G01R 1/0408; G01R 1/067; G01R 1/073; G01R 1/07307; G01R 1/07357; G01R 31/026; G01R 31/2603; G01R 31/2887; G01R 31/3644; G01R 31/40; Y02E 10/50

See application file for complete search history.

(56) References Cited

U.S. PATENT DOCUMENTS

| | | | |
|---|---|---|---|
| 6,365,825 B1* | 4/2002 | Hayashi | H01L 31/046 136/243 |
| 2007/0068567 A1* | 3/2007 | Rubin | H02S 50/10 136/243 |
| 2010/0045264 A1* | 2/2010 | Kiesewetter | G01R 1/07342 324/149 |
| 2010/0045265 A1* | 2/2010 | Kiesewetter | H01L 31/02008 324/149 |
| 2010/0201349 A1* | 8/2010 | Taira | G01R 31/2603 324/149 |

(Continued)

FOREIGN PATENT DOCUMENTS

| | | |
|---|---|---|
| CN | 101655539 A | 2/2010 |
| CN | 103518142 A | 1/2014 |

(Continued)

OTHER PUBLICATIONS

English machine translation of Ishii JP2006118983 (Year: 2006).*

*Primary Examiner* — Lee E Rodak

(74) *Attorney, Agent, or Firm* — Alleman Hall Creasman & Tuttle LLP

(57) ABSTRACT

To achieve higher measurement accuracy, repeated reproducibility, and durability than a probe using a gold thread, a probe used to measure electrical characteristics of a solar battery cell includes one or more thin plates that are conductors. The thin plates each have an elongated thin plate-like main body, one or more contacts that are thin wires extending in a longitudinal direction of the main body, and spring elements that are thin wires connecting the main body to the respective contacts.

11 Claims, 17 Drawing Sheets

(56) References Cited

U.S. PATENT DOCUMENTS

| | | | | |
|---|---|---|---|---|
| 2013/0200918 | A1* | 8/2013 | Rubin | H02S 50/10 324/761.01 |
| 2014/0239997 | A1* | 8/2014 | Higuchi | H02S 50/10 324/756.03 |
| 2014/0347087 | A1* | 11/2014 | Wirth | G01R 1/07342 324/761.01 |

FOREIGN PATENT DOCUMENTS

| | | | |
|---|---|---|---|
| CN | 103858018 A | | 6/2014 |
| CN | 104702211 A | | 6/2015 |
| JP | 2006118983 A | * | 5/2006 |
| JP | 2014215132 A | | 11/2014 |
| WO | 2012051695 A | | 4/2012 |

* cited by examiner

PROBE AND SOLAR BATTERY CELL MEASUREMENT APPARATUS

TECHNICAL FIELD

The present invention relates to a probe used to measure an output from a solar battery cell, and a solar battery cell measurement apparatus using the probe.

BACKGROUND ART

Quality check and classification of a solar battery cell are performed based on measurement results of current and voltage characteristics of power generated when the solar battery cell is irradiated with light by a solar simulator.

For example, for a busbar-less solar battery cell, a bar-type probe is disposed at a position where a busbar electrode was conventionally installed, and is brought into contact with a plurality of finger electrodes to measure outputs from the solar battery cell.

Screen printing causes minute variations in height of the finger electrodes formed on the surface of the solar battery cell. For this reason, the use of the conventional probe makes the contact state of each of the finger electrodes unstable, thereby largely changing the electrical resistance at each measurement, which is disadvantageous for the reproducibility of the measurement.

To solve such a problem, the applicant of this application developed a probe including an elongated holder that holds a gold thread, and proposed that the gold thread is brought into contact with each of the finger electrodes to measure outputs from the solar battery (Refer to Patent Literature 1). By using such a probe, even when the finger electrodes vary in height, elastically deformable silk yarn in the gold thread can absorb the variation, stabilizing the contact state to improve the repeated reproducibility of measurement.

CITATION LIST

Patent Literature

Patent Literature 1: Japanese Unexamined Patent Application Publication No. 2014-215132

SUMMARY OF THE INVENTION

Technical Problem

An initial object of the present invention is to provide a probe having higher measurement accuracy, repeated reproducibility as well as durability than the conventional probe using the gold thread.

Solution to Problem

That is, a probe according to the present invention is a probe for measuring an electrical characteristic of a solar battery cell. The probe includes one or more thin plates that are conductors. the one or more thin plates each have an elongated thin plate-shaped main body, one or more contacts that are thin wires extending in a longitudinal direction of the main body, and spring elements that are thin wires connecting the main body to the respective contacts.

The thin wire described herein is not limited to a thin wire having a uniform cross section, and includes a thin wire having a rectangular cross section and the like.

With such a configuration, even if the finger electrodes vary in height, when the probe is pressed onto the solar battery cell, the spring elements can absorb the variation due to their elasticity to stabilize the contact state of each finger electrode with the contact. For this reason, the contact resistance can be prevented from changing at each measurement to ensure the repeated reproducibility of measurement.

Further, the contacts are formed of the conductive thin wire, and thus hardly become worn out by the finger electrodes even after repeated measurement. In addition, the spring elements are also formed of the conductive thin wire, and thus are pressed within the elastic deformable scope. For this reason, the resilience is hardly lowered. Therefore, the probe of the present invention may have a longer lifespan than conventional probes.

When the probe is pressed onto the solar battery cell, preferably, the contacts are pressed while sliding on the surface of the solar battery cell to attain a good contact state with the finger electrodes. To achieve this, the spring elements may have a portion inclined relative to a direction in which the one or more contacts are pressed onto the solar battery cell.

To reflect the stiffness of the conductor itself constituting the thin plate on each spring element to suppress deterioration of the spring elements even after repeated measurement and extend the lifespan, the spring elements of each thin plate may be bent in a thickness direction of the thin plate. With such a configuration, when the probe is pressed onto the solar battery cell, the spring elements and the contacts are displaced in the thickness direction, the contacts are rubbed against in the extending direction of the finger electrodes. Therefore, the contact state of the contacts with the finger electrodes is further stabilized.

Alternatively, to achieve the suitable resilience of the spring element for measurement, the spring elements of each thin plate may be bent in the longitudinal direction of the main body.

To increase the contact area of the finger electrodes with the contacts without shortening the lifespan of the spring elements and the contacts, a plurality of the thin plates may be stacked in a thickness direction.

To increase the probability of the good contact state of the contacts with all finger electrodes to achieve more accurate measurement, a plurality of the contacts may be provided at predetermined intervals in the longitudinal direction, and the plurality of the contacts in at least two of a plurality of the thin plates may be shifted in phase.

For example, even in the case where the central finger electrode among three adjacent finger electrodes is short, to prevent the contact from failing to contact the central finger electrode supported by the other two finger electrodes, a size of each of the plurality of contacts in the longitudinal direction may be set to be smaller than twice an interval of the finger electrodes.

To facilitate the plurality of contacts in one thin plate making contact with all finger electrodes, the predetermined intervals may be set such that each of the plurality of the contacts makes contact with the one or two of the finger electrodes.

When the probe is pressed onto the solar battery cell, to maintain the state where the contacts extend in the longitudinal direction of the main body to suppress the variation in the contact state with each finger electrode among measurements, each end of the one or more contacts may be provided with one of the spring elements. With such a configuration, since a parallel link mechanism is formed between the main body and the contacts, at pressing of the probe, it is hard for the contacts to diagonally enter into the surface of the solar battery cell, achieving the good contact state.

To allow one probe to simultaneously measure current and voltage generated from the solar battery cell at almost the same position to measure, for example, I-V (current and voltage) characteristics more accurately, among a plurality of the thin plates stacked in the thickness direction, at least one thin plate may be a voltage-measuring thin plate, and a remainder of the thin plates may be current-measuring thin plates, and an insulating layer may be formed between the voltage-measuring thin plate and the current-measuring thin plates. With such a configuration, a voltage-measuring point and a current-measuring point on the solar battery cell can be made closer to each other to estimate the I-V characteristics more accurately.

A solar battery cell measurement apparatus including the probe of the present invention and a holder for pinching an end of the main body in the thickness direction and conductively holding the end, in a plurality of the thin plates stacked in a thickness direction may maintain a predetermined measurement accuracy, for example, over repeated measurement of the I-V characteristics of numerous solar battery cells.

To eliminate the need of wiring directly to the probe for extracting the current and voltage generated from the solar battery cell to achieve a wireless configuration, and to appropriately detect an optical current generated from the solar battery cell, a first outermost face of the probe may be formed of the current-measuring thin plate, and a second outermost face may be formed of the voltage-measuring thin plate, of the plurality of thin plates. And, the holder may include a current acquisition terminal having a receiving face pressed by the main body of the current-measuring thin plate, and a voltage acquisition terminal making contact with the main body of the voltage-measuring thin plate, the voltage acquisition terminal pressing the probe onto the receiving face.

Advantageous Effects of Invention

As described above, the probe of the present invention, the spring elements and the contacts can absorb the variation of the finger electrodes in height to keep a high repeated measurement accuracy. Further, the spring elements and the contacts are formed of thin wires as a part of the conductive thin plates, and thus are resistant to wear and difficult to be lowered in resilience, which leads to a longer lifespan than conventional probes.

LIST OF REFERENCE CHARACTERS

Figure 1:
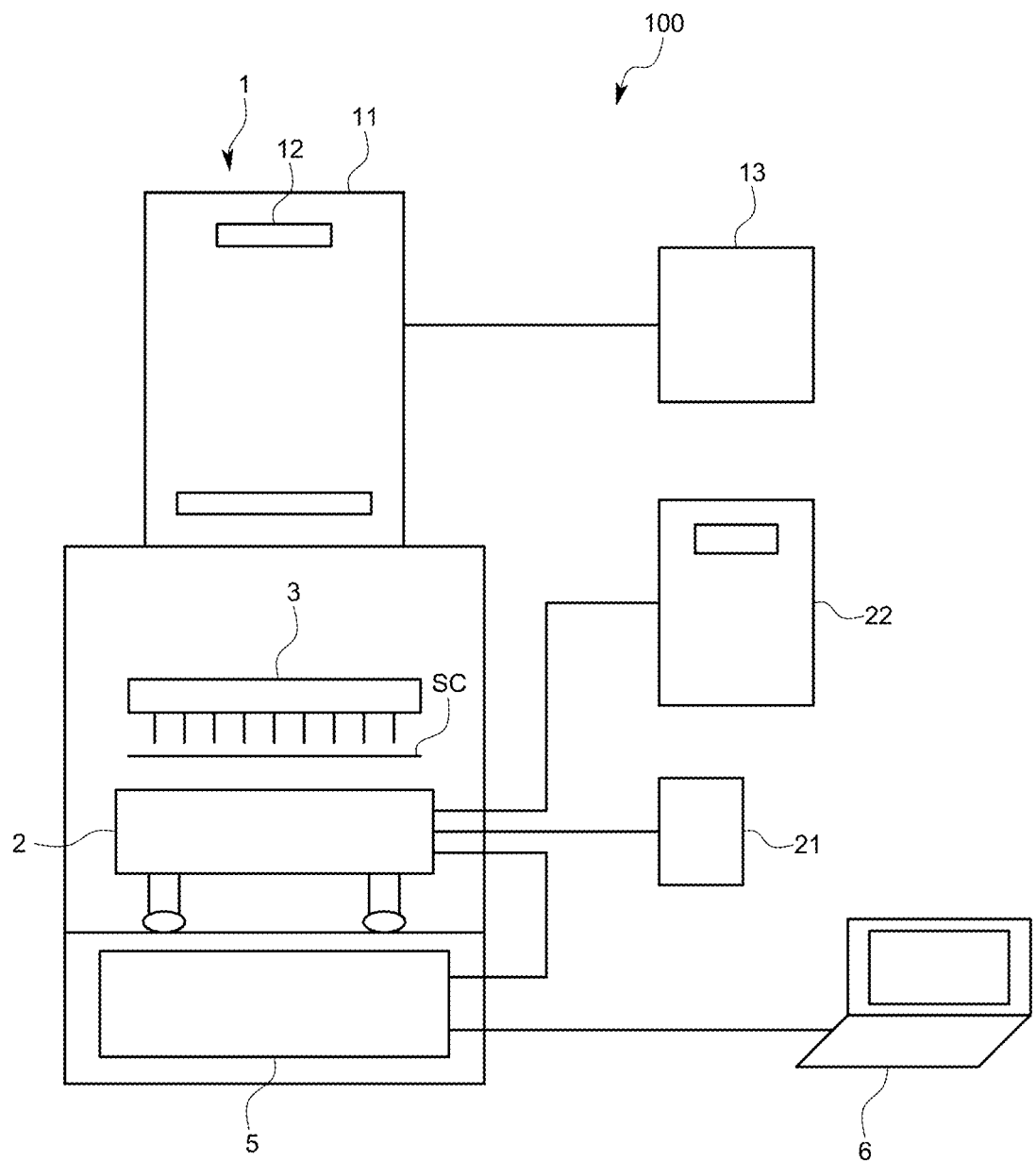
FIG. 1 is a schematic view illustrating a probe in accordance with a first embodiment of the present invention, and a solar battery cell measurement apparatus using the probe.

100: Solar battery cell measurement apparatus
3: Probe
3A: Thin plate
31: Main body
32: Contact
33: Spring element
4: Holder
41: Current acquisition terminal
42: Receiving face
44: Voltage acquisition terminal

DESCRIPTION OF EMBODIMENTS

A probe 3 in accordance with a first embodiment of the present invention, and a solar battery cell measurement apparatus 100 using the probe 3 will be described below with reference to FIGS. 1 to 5. The solar battery cell measurement apparatus 100 in accordance with the present embodiment serves to measure I-V (current and voltage) characteristics of a solar battery cell SC, for example, to evaluate and classify the manufactured solar battery cells SC according to the characteristics. In the first embodiment, as the solar battery cell SC, the I-V characteristics of a highly efficient solar battery such as a heterojunction solar battery are measured.

Briefly describing each component of the solar battery cell measurement apparatus 100, as illustrated in FIG. 1, the solar battery cell measurement apparatus 100 includes at least a solar simulator 1 that irradiates the solar battery cell SC with artificial sunlight, an irradiation control part 13 that controls the solar simulator 1, a sample stage 2 on which the solar battery cell SC is placed, the probe 3 that makes contact with finger electrodes F formed on a surface of the solar battery cell SC, an I-V tester 5 that measures the I-V characteristics of the solar battery cell SC, and a control arithmetic unit 6 (personal computer) that controls each of the components and performs various operations.

The solar simulator 1 is configured of a substantially rectangular parallelepiped-shaped housing 11 with an opened bottom face, and a light source 12 accommodated in the housing 11 on the side of its upper surface. The light source 12 is, for example, a substantially ring-shaped long arc xenon lamp, and irradiates the solar battery cell SC with artificial sunlight as flash light (pulse light).

The irradiation control part 13 controls an irradiation state of the artificial sunlight applied to the solar battery cell SC by the solar simulator 1.

The sample stage 2 is connected to a vacuum pump 22 so as to adsorb and hold a back face of the solar battery cell SC, and is cooled by a chiller 21 so that the temperature of the solar battery cell SC may be maintained to be a temperature recommended in a measurement condition at measurement of the I-V characteristics.

When the solar battery cell SC is placed on the sample stage 2, the I-V tester 5 is electrically connected to the solar battery cell SC, and at least includes a load power source that sweeps an applied voltage with respect to the solar battery cell SC, an applied voltage control part that controls a voltage applied from the load power source to the solar battery cell SC, and a current-voltage measurement mechanism consisting of an ammeter IM and a voltmeter VM, which measure the current and the voltage outputted from the solar battery cell SC, respectively, via the probe 3, while the load power source sweeps the applied voltage with respect to the solar battery cell SC.

Next, details of the bar-type probe 3 will be described below.

The probe 3 is fixed to a drive mechanism not illustrated, and is vertically driven to be close to and away from the solar battery cell SC placed on the sample stage 2. As described later, a holder 4 is provided between the drive mechanism and the probe 3 to connect them to each other, and the probe 3 is attached to and detached from the holder 4. The holder 4 is conductively connected to the probe 3, and includes a plurality of terminals that extract currents and voltages occurring in the solar battery cell SC. These terminals are connected to the ammeter IM and the voltmeter VM in the I-V tester 5 via respective cables.

Figure 2:
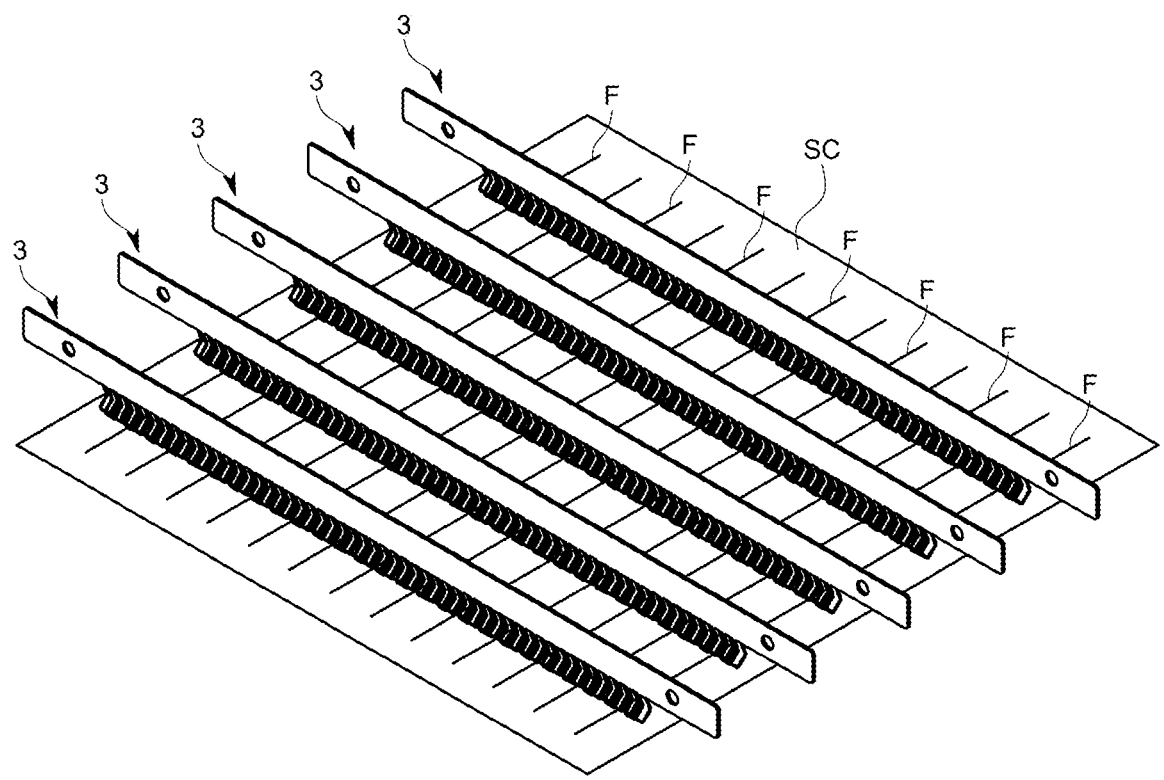
FIG. 2 is a schematic perspective view illustrating a state where the probe in the first embodiment is installed in a busbar-less solar battery.

In the first embodiment, as illustrated in FIG. 2, the five probes 3 in total are disposed in parallel on one solar battery cell SC so as to be orthogonal to each of the finger electrodes F. That is, the solar battery cell SC is a busbar-less solar battery cell SC, and the plurality of finger electrodes F for collecting currents outputted from points on a substrate are screen-printed on the solar battery cell SC using a silver paste or the like. In other words, the finger electrodes F are provided at predetermined intervals, and the probes 3 in the first embodiment are disposed in the direction in which the finger electrodes F are aligned. Also, the probes 3 are disposed so as to simultaneously make contact with the finger electrodes F. The place where the probes 3 are disposed is also a place where wire electrodes and so on are formed when a plurality of solar battery cells SC constitute a solar panel in a later process.

The finger electrodes F formed by screen printing vary in height due to minute irregularities of a reflection structure formed on the surface of the substrate, the printing accuracy, and any other reason. Specifically, one finger electrode F varies in height when viewed in the extending direction, as well as each finger electrode F minutely varies in height at the points at which the probe 3 are disposed.

Therefore, in the case where the probe 3 is rigid as is conventional, and thus, it cannot absorb the variation of each finger electrode F in height, only the finger electrodes F higher than the other finger electrodes F with respect to the surface of the substrate can support the probe 3, resulting in that the probe 3 may not be in contact with all of the finger electrodes F. When the I-V characteristics are measured in the state where some of the finger electrodes F are not in contact with the probe 3, the current or voltage is underestimated, failing to correctly measure the I-V characteristics.

For this reason, even when the probe 3 in the first embodiment varies in height at the contact points with each finger electrodes F, the probe 3 can absorb the variation in height so as to achieve a good contact state with all of the finger electrodes F.

Figure 3:
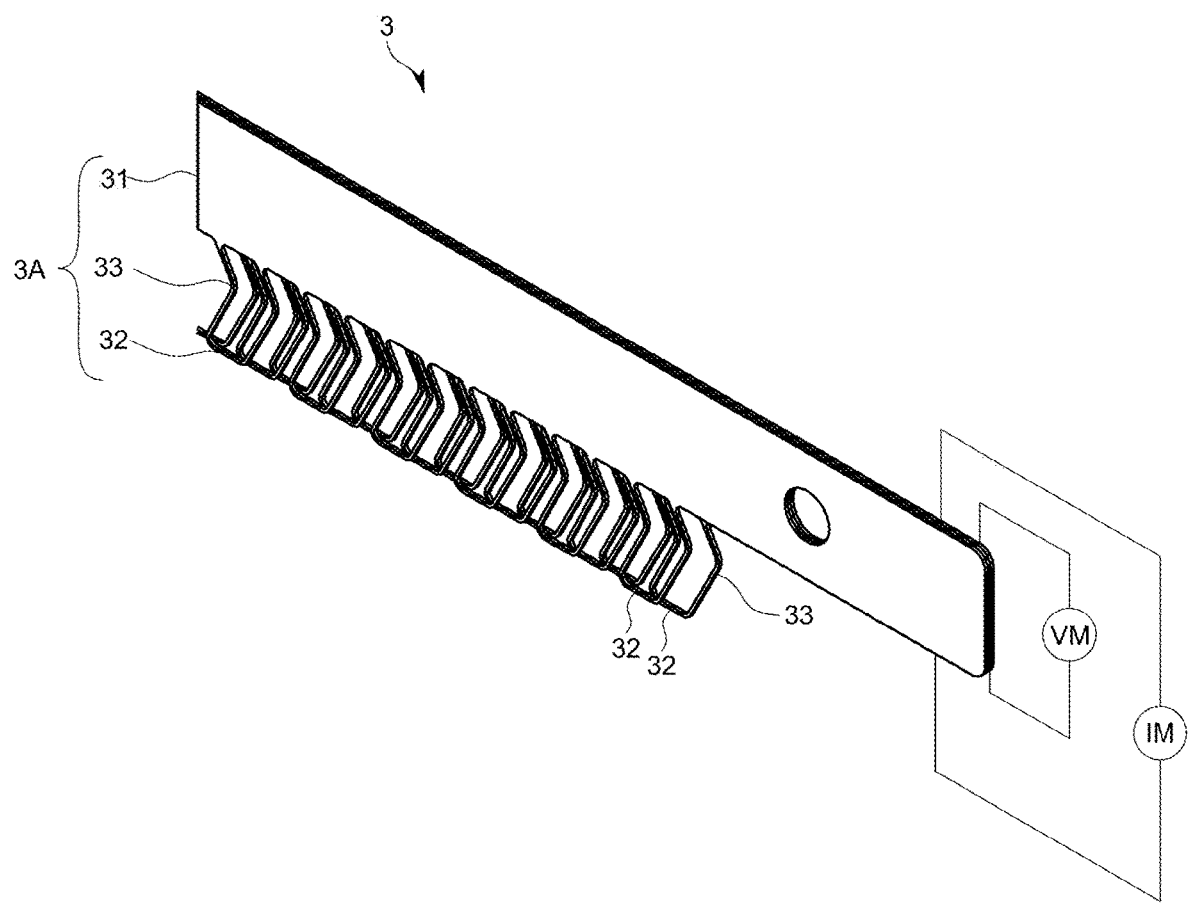
FIG. 3 is a schematic enlarged perspective view illustrating an end face of the probe in the first embodiment.
Figure 4:
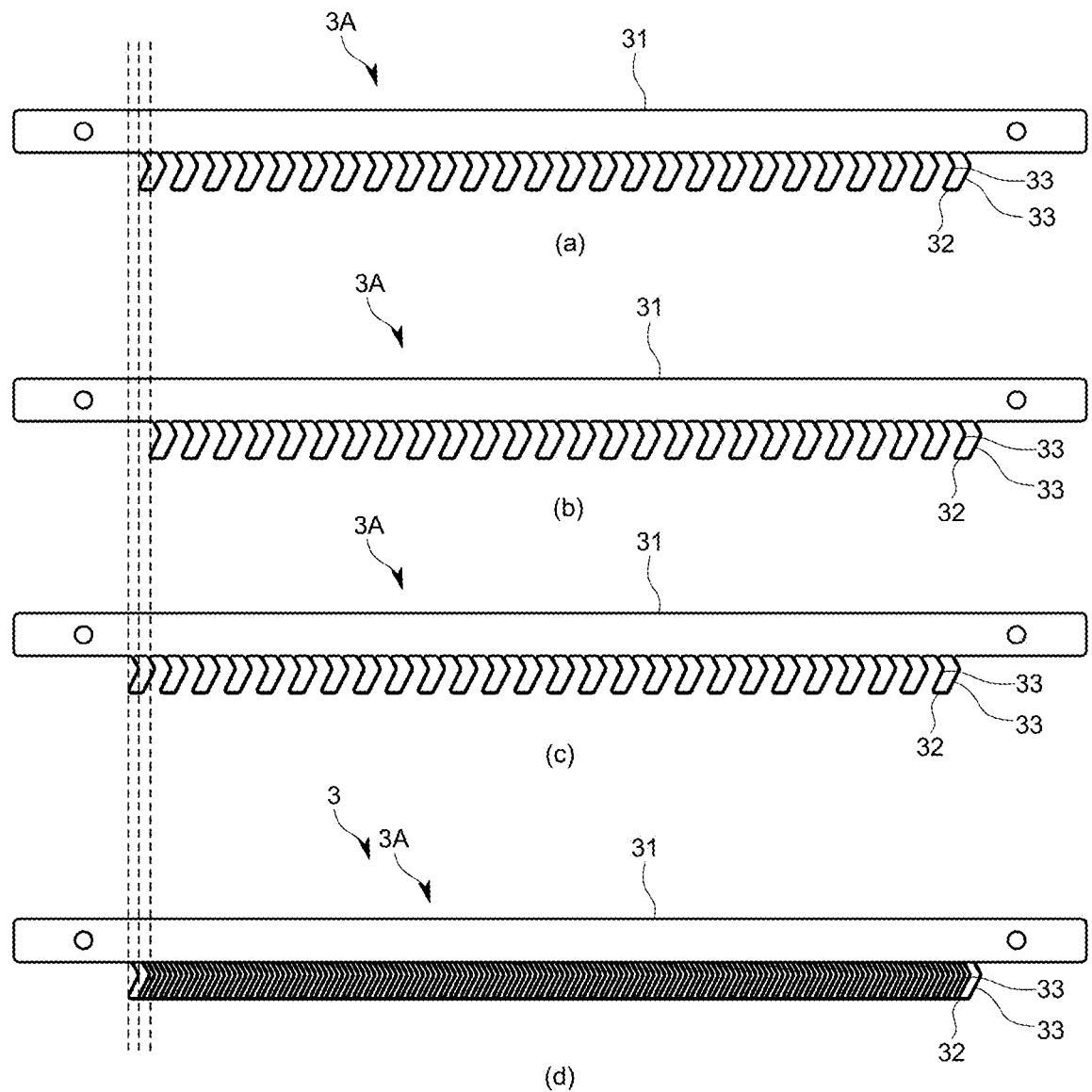
FIG. 4 is a schematic view illustrating a plurality of thin plates constituting the probe in the first embodiment, and the state where the thin plates are stacked in a thickness direction.

Specifically, as illustrated in FIGS. 3 and 4, the probe 3 is formed by bonding a plurality of thin plates 3A that are conductors together in a thickness direction. The thin plates 3A each include a main body 31 shaped like an elongated thin plate, a plurality of contacts 32 that are thin wires extending in a longitudinal direction of the main body 31, and spring elements 33 that are thin wires and connect the main body 31 to the respective contacts 32. For example, the thin plate 3A such as a thin plate made of copper alloy is punched to form the spring elements 33 and the contacts 32, which are formed of thin wires. Here, it is set that the thickness of each of the thin plates 3A is equal to or smaller than 1 mm, and the diameter of each of the spring element 33 and the contact 32 is also equal to or smaller than 1 mm. That is, the thickness of each thin plate 3A is set such that the thickness of the probe 3 formed by bonding the plurality of thin plates 3A together in the thickness direction becomes the substantially same as the width of the above-mentioned wire electrode. To stack the plurality of current-measuring thin plates 3A and the voltage-measuring thin plates 3A, the thickness of each thin plate 3A may be set to fall within a range from 0.05 mm to 0.4 mm. More preferably, the thickness of the thin plate 3A falls within a range from 0.05 mm to 0.2 mm.

The main body 31 is held to the drive mechanism not illustrated at both ends thereof by the holder 4, and serves to transmit the current or voltage generated in the solar battery cell SC to the ammeter IM or the voltmeter VM through the contacts 32 and the spring elements 33. The main body 31 of each thin plate is integrally adhered. More specifically, the main body 31 of the current-measuring thin plate 3A is adhered using a conductive adhesive. The voltage-measuring thin plate 3A and the current-measuring thin plate 3A have an insulating layer 31S (illustrated in only below-mentioned FIG. 7) formed of insulating paper therebetween, and each of the plates are adhered to the insulating layer by an adhesive. That is, one probe 3 in the first embodiment can measure both currents and voltages. In the first embodiment, the plurality of current-measuring thin plates 3A and one voltage-measuring thin plate 3A are provided. The reason why the plurality of current-measuring thin plates 3A are provided is to allow a large current occurring in the solar battery cell SC. On the contrary, only one voltage-measuring thin plate 3A is provided since a large current does not pass thereto.

In the first embodiment, a main body 31V of the voltage-measuring thin plate 3A and main bodies 31C of the current-measuring thin plates 3A are stacked together so as to form the plates on a front face and a back face of the probe 3. That is, the voltage-measuring thin plates 3A and at least one current-measuring thin plate 3A each constitute an outermost face of the probe 3A. With such a configuration, the probe for measuring current and voltage is united, and the conductors are brought into contact with the respective main bodies 31V and 31C to independently extract the current or voltage.

Figure 5A:
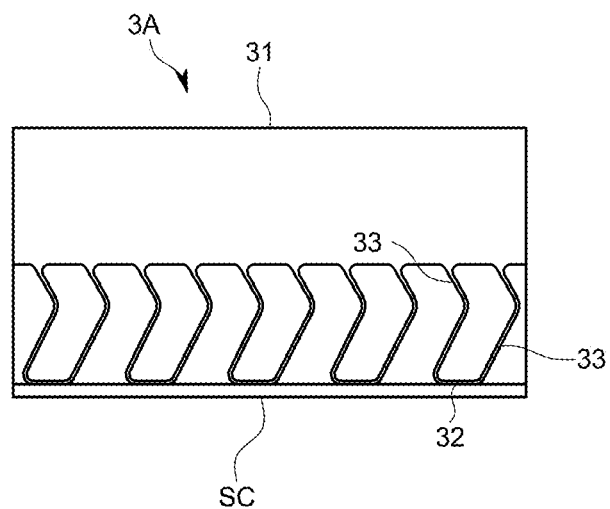
FIGS. 5A and 5B are schematic enlarged views illustrating a natural state and a pressed state of the probe in the first embodiment.
Figure 5B:
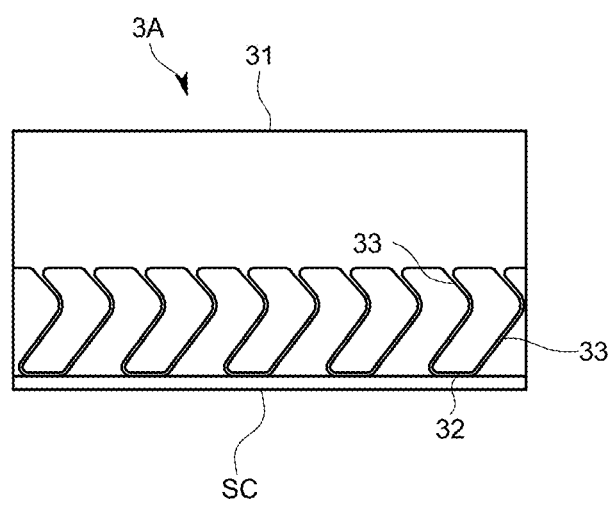

As illustrated in FIGS. 4, 5A, and 5B, the contacts 32 in the first embodiment are a plurality of thin wires formed in parallel with the longitudinal direction of the main body 31, and are cyclically disposed at predetermined intervals. The length of the contacts 32 in the longitudinal direction is set to be smaller than twice the interval between the finger electrodes F. In the first embodiment, the length and the interval of the contacts 32 are configured such that only one finger electrode F can make contact with the contacts 32.

The spring elements 33 are configured to have a portion inclined relative to a pressing direction of the probe 3 (vertical direction). In the first embodiment, both ends of one contact 32 are independently connected to the main body 31. Each of the spring elements 33 is substantially shaped like a "C," and two spring elements 33 are formed on one contact 32 to constitute a parallel link structure between the main body 31 and the contacts 32. That is, in the first embodiment, the main body 31, the contacts 32, and the spring elements 33 are disposed almost in a predetermined plane, and the variation occurs only in a direction along the predetermined plane.

That is, when the probe 3 in a natural state as illustrated in FIG. 5A is pressed onto the solar battery cell SC, as illustrated in FIG. 5B, the spring elements 33 each are bent so as to decrease an angle at the center thereof. Since the pair of spring elements 33 that support one contact 32 are similarly deformed, the contact 32 gets closer to the main body 31 while remaining parallel to the longitudinal direction of the main body 31. At this time, the parallel link structure constituted of the main body 31, the pair of spring elements 33, and one contact 32 is also subjected to shear deformation and accordingly, the contact 32 slightly moves from the position in the natural state in the longitudinal direction. For this reason, when the probe 3 is pressed onto the solar battery cell SC, the contacts 32 are pressed downward and is also slightly rubbed against the finger electrodes F. This can make the contact state between the contacts 32 and the finger electrodes F suitable for measurement of the I-V characteristics.

As illustrated in FIG. 4 at (a) to (c), for the plurality of thin plates 3A constituting the probe 3 in the first embodiment, the contacts 32 and the spring elements 33 are disposed at different positions with respect to the main body 31.

More specifically, when viewing the probe 3 formed by stacking the plurality of thin plates 3A in the thickness direction, as illustrated in FIG. 4 at (d), the contacts 32 and the spring elements 33 are arranged such that the contacts 32 of each thin plate 3A form one straight line. In other words, the spring elements 33 and the contacts 32 of the thin plates 3A are shifted in phase, for example, by 120 degrees. Put another way, each thin plate 3A is formed such that the contacts 32 and the spring elements 33 form teeth of a comb with respect to the main body 31. The teeth of the thin plates 3A are shifted in phase in the longitudinal direction and thus, when the thin plates 3A are stacked, the teeth partially overlap each other to form a straight line at their tips.

In the thin plates 3A, only face plates of the main body 31 are adhered to each other, and the spring elements 33 and the contacts 32 of one thin plate 3A are not adhered to those of another thin plate 3A. Therefore, the spring elements 33 and the contacts 32 are freely deformable or movable.

The plurality of thin plates 3A, which have the spring elements 33 and the contacts 32 differently arranged with respect to the main body 31, can be stacked in the thickness direction as described, to form overlapping portions of the contacts 32 in the thickness direction as illustrated in an enlarged perspective view of FIG. 3. The contacts 32 can freely move to increase the probability that the contacts 32 of any thin plate 3A make contact with the finger electrodes F.

The contacts 32 are formed of a conductive thin wire made of copper alloy or the like, and have a higher hardness than the finger electrodes F made of a silver paste, for example. For this reason, even if the I-V measurement is repeated for numerous solar battery cells SC, the contacts 32 are resistant to wear.

Further, the spring element 33 is also formed of a conductive thin wire, and thus is less subjected to plastic deformation as compared with biomaterials such as silk thread, and hardly changes in resilience even after repeated measurement. Therefore, it can suppress a phenomenon in which repeated measurements lower the pressing force of the contacts 32 onto the finger electrodes F through the spring elements 33.

Based on these facts, the probe of the present invention can achieve accurate I-V measurement while keeping the suitable contact state between the contacts 32 and the finger electrodes F for the measurement, and also maintain the repeated measurement accuracy for a longer time to extend the lifespan compared to conventional probes.

Figure 6A:
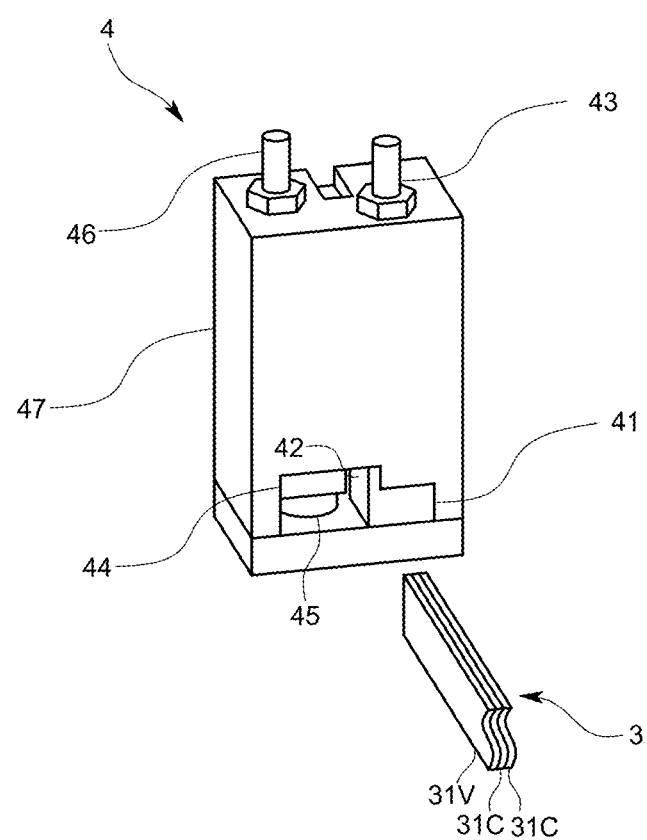
FIGS. 6A and 6B are schematic perspective views illustrating a holder for connecting the probe in the first embodiment and a drive mechanism vertically operating the probe.
Figure 6B:
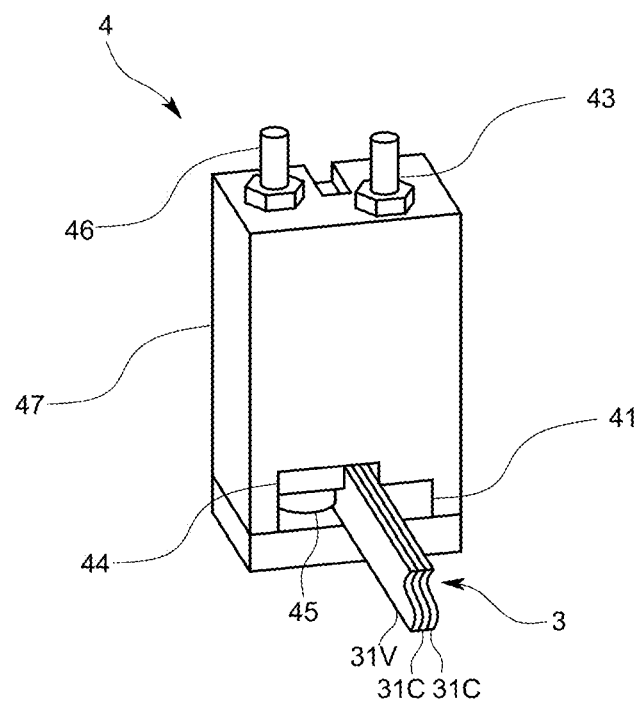

Next, the holder 4 that removably holds ends of the probe 3 and connects the ends to the drive mechanism will be described below with reference to FIGS. 6A to 7B. The holder 4 has a substantially rectangular parallelepiped shape, and pinches and holds the both ends of the probe 3 in the thickness direction. The holder 4 is conductively in contact with each face plate of the probe 3, and is configured to separately extract currents and voltages from the solar battery cell SC. Specifically, as illustrated in FIG. 6A, a body 47 formed of an insulator has a recess into which an end of the probe 3 are introduced, and a portion of a current acquisition terminal 41 and a portion of a voltage acquisition terminal 44 are exposed on the recess. As illustrated in FIG. 6B, the end of the probe 3 is inserted between the current acquisition terminal 41 and the voltage acquisition terminal 44 and then, pressed in the thickness direction and fixed thereto.

The current acquisition terminal 41 and the voltage acquisition terminal 44 pass through the body 47, and are partially exposed from an upper end face of the body. These form a current terminal block 43 and a voltage terminal block 46, which are connected to the ammeter IM and the voltmeter VM, respectively, by wiring. That is, there is no need to directly connect the wires to the probe 3 by soldering or the like. Therefore, the wiring can be made very simple, further facilitating the replacement of the probe 3 for the holder 4 than is conventional.

Figure 7A:
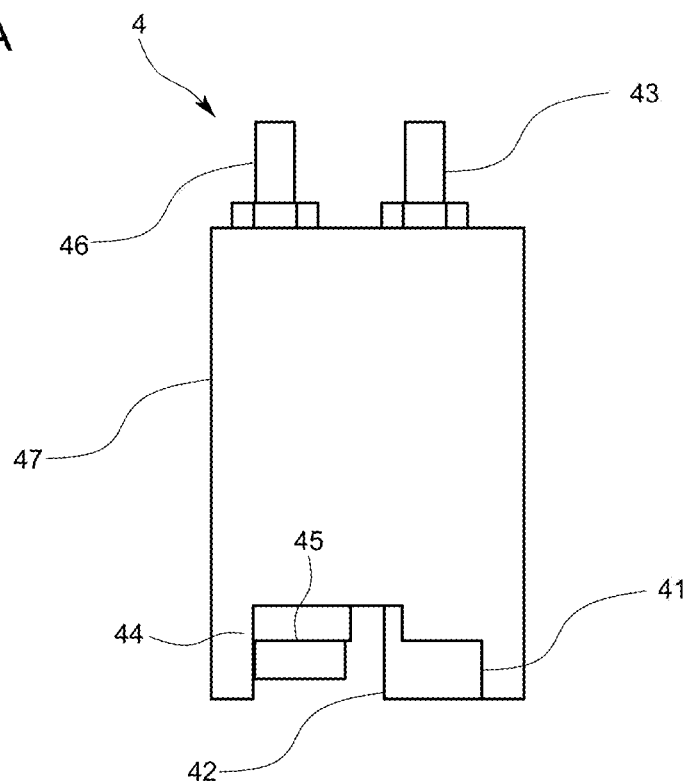
FIGS. 7A and 7B are schematic views illustrating a pinching configuration of the holder in the first embodiment for the probe.
Figure 7B:
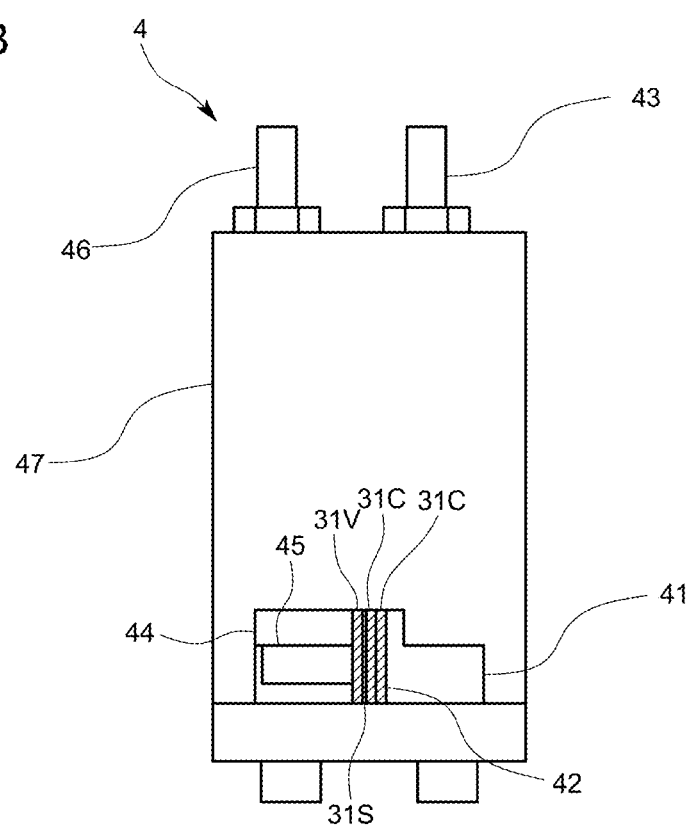

As illustrated in FIGS. 7A and 7B, the current acquisition terminal 41 includes a receiving face 42 onto which the face plate of the main body 31C of the current-measuring thin plate 3A is pressed, to achieve a surface contact of the face plate of the main body 31C with the receiving face 42. In this manner, the current acquisition terminal 41 has a large contact area with the current-measuring thin plate 3A so as to pass a large current.

The voltage acquisition terminal 44 includes an eccentric screw 45. When the eccentric screw 45 is rotated in the state where the probe 3 is inserted between the current acquisition terminal 41 and the voltage acquisition terminal 44, as illustrated in FIGS. 7B and 7B, a side face of the eccentric screw 45 presses the probe 3 in the thickness direction. As a result, the end of the probe 3 is pinched between the side face of the eccentric screw 45 and the receiving face 42 to be fixed. That is, the voltage acquisition terminal 44 is in line-contact with the face plate of the main body 31V of the voltage acquisition thin plate 3A. The reason why the voltage acquisition terminal 44 is in line-contact, in place of surface-contact, with the face plate is that a large current does not pass to the voltage acquisition terminal 44 unlike the current acquisition terminal 41. Such pinching of the line-contact and the surface-contact using the eccentric screw 45 and the receiving face 42 can achieve a simple attachment/detachment configuration and the contact state suitable for current and voltage measurement.

Figure 8A:
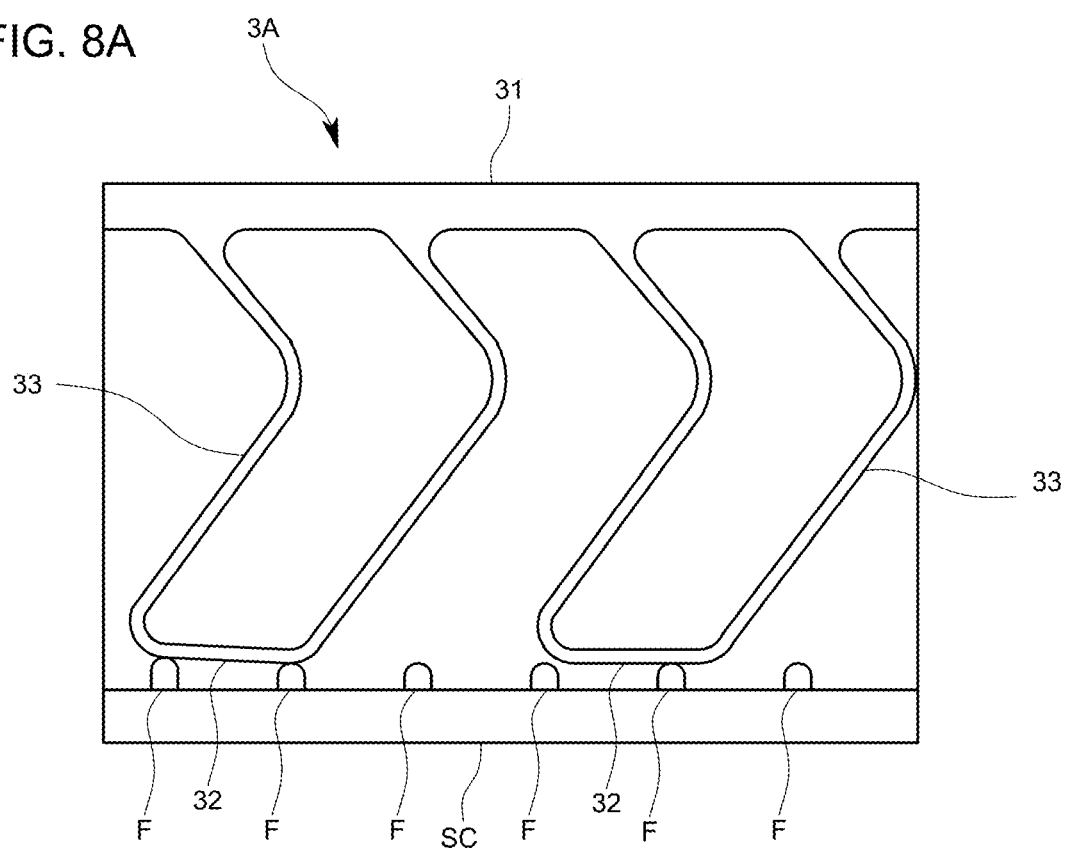
FIGS. 8A and 8B are schematic enlarged views illustrating a modification example of the probe in the first embodiment.
Figure 8B:
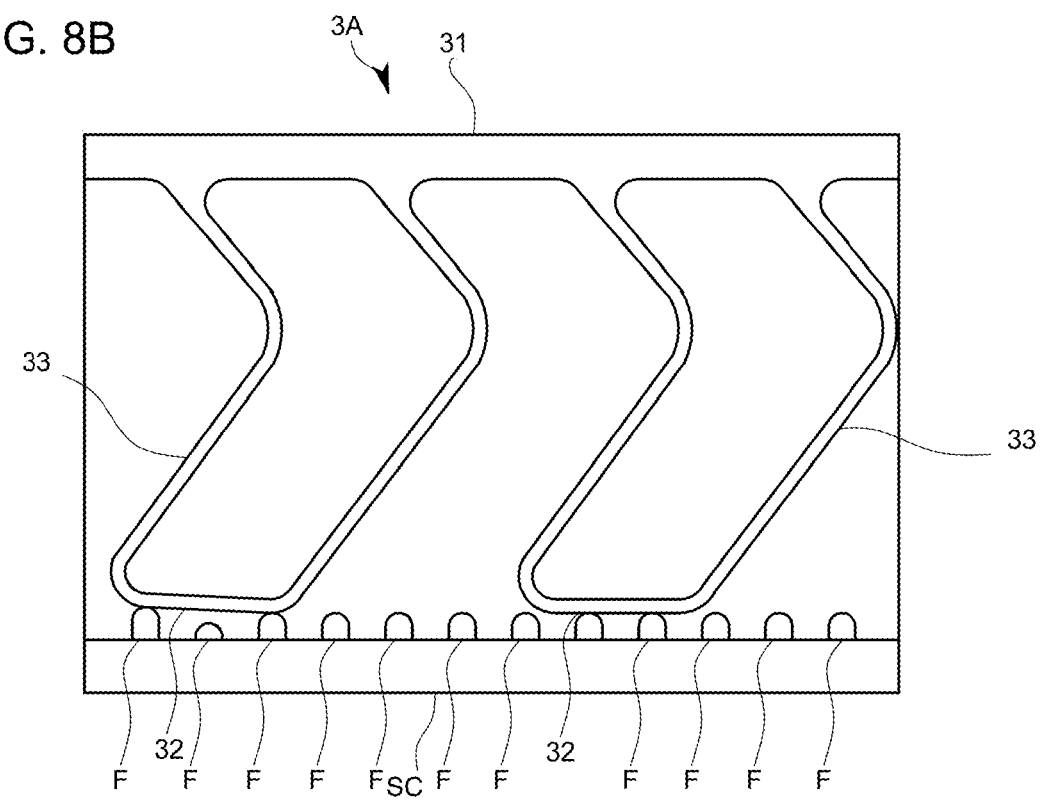

Next, a modification example of the probe 3 in the first embodiment will be described with reference to FIGS. 8A and 8B. For ease of understanding, FIGS. 8A and 8B illustrate only one thin plate 3A; however, the plurality of thin plates 3A are actually stacked in the thickness direction such that at least one contact 32 of any thin plate 3A makes contact with all finger electrodes F. In this modification example, it is assumed that the number of the finger electrodes F is larger than that in the example described with reference to FIG. 1 and some figures. That is, in the modification example, as illustrated in FIG. 8A, the size and predetermined interval of the contacts 32 in the longitudinal direction are set such that two finger electrodes F at most can make contact with one contact 32. Specifically, the size of the contact 32 in the longitudinal direction is set to be slightly larger than the interval of the finger electrodes F, and smaller than twice of the interval of the finger electrodes F.

By setting the size of the contacts 32 as described above, it can be prevented that no contact 32 makes contact with any of the finger electrodes F in the state where the probe 3 is pressed onto the solar battery cell SC. That is, as illustrated in FIG. 8A, even when the adjacent finger electrodes F vary in height, the contacts 32 can be inclined due to the resilience of the spring elements 33 to reliably make contact with two finger electrodes F having different heights.

Since the size of the contact 32 in the longitudinal direction is set to be smaller than twice of the interval of the finger electrodes, in the case where the central finger electrode F among three adjacent finger electrodes F is short as illustrated in FIG. 8B, the contact 32 contacting only the outer finger electrodes F to form a bridge-like state can be prevented. Therefore, in the modification example, the finger electrode F that is not in contact with any contact 32 does not exist.

Next, a second embodiment of the present invention will be described below with reference to FIG. 9. It is noted that members corresponding to the members described in the first embodiment are given the same reference numerals.

Figure 9:
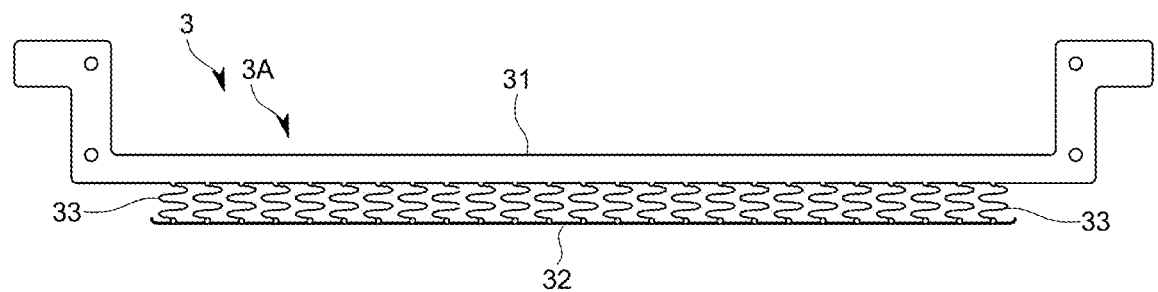
FIG. 9 is a schematic view illustrating a probe in accordance with a second embodiment of the present invention.

As illustrated in FIG. 9, a probe 3 in the second embodiment is different from the probe 3 in the first embodiment in the shape of the spring elements 33 and the contact 32. Specifically, the spring element 33 is a thin wire curved multiple times into a substantial S shape. The contact 32 is not divided into plural wires, but is one thin wire that can cross all finger electrodes F. Both ends of the contact 32 are partially oriented towards the main body 31 and formed so as to slide along the surfaces of the finger electrodes F and the solar battery cell SC without biting into the surfaces at pressing.

As in the first embodiment, the probe can achieve the good contact state with the solar battery cell SC, and suppress a change in the contact state caused by wear and deterioration of the resilience even after repeated measurements. Therefore, both accurate measurement and extended lifespan can be realized.

Next, a third embodiment of the present invention will be described with reference to FIGS. 10A to 12. The same members as those in the first embodiment are given the same reference numerals.

The probe 3 in the third embodiment is different from the probe 3 in the first embodiment in the number of thin plates 3A stacked in the thickness direction and that spring elements are bent in the thickness direction of the thin plates 3A. That is, the spring elements 33 are disposed also outside of the predetermined plane defined by the main body 31.

Figure 10A:
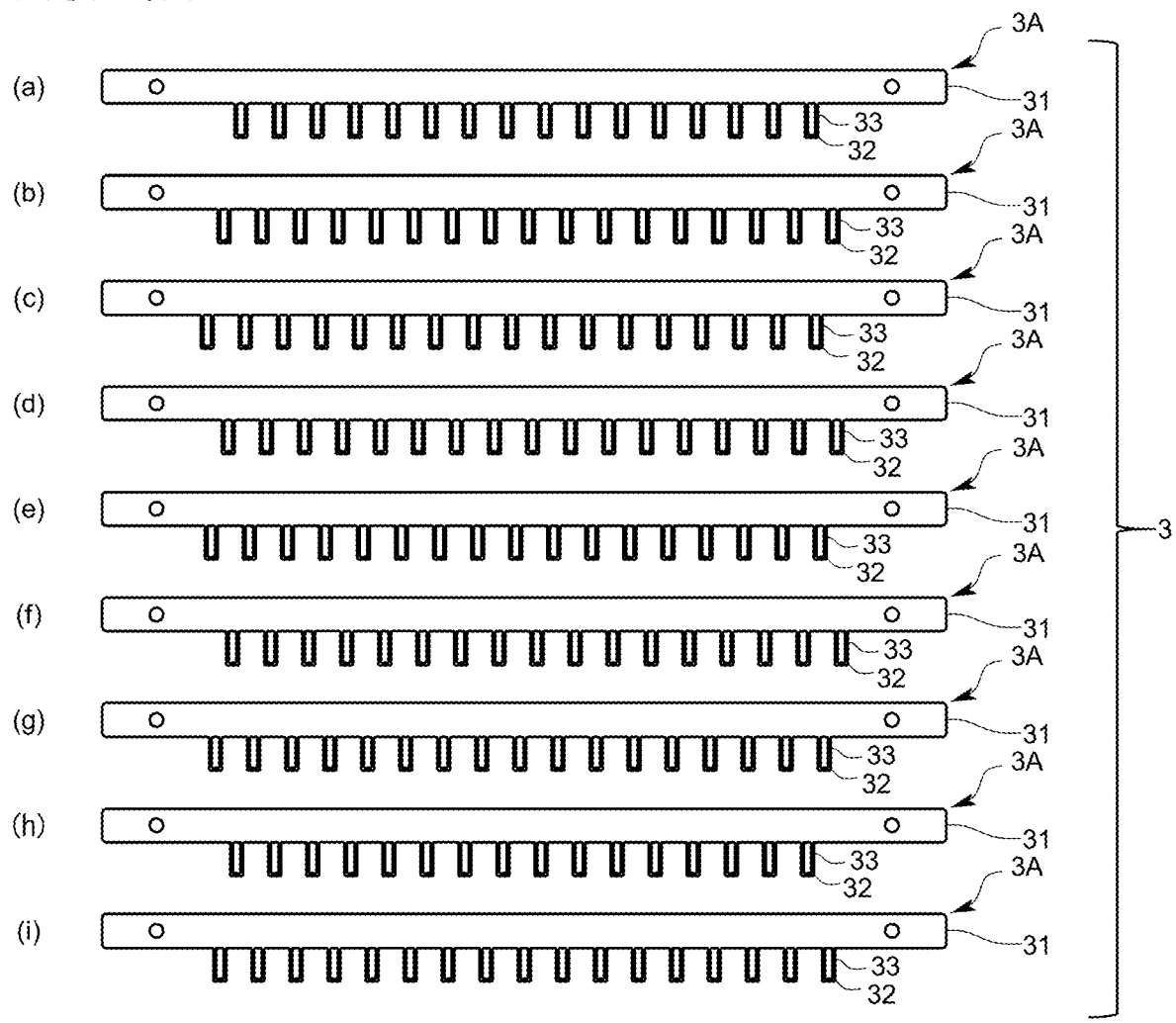
FIGS. 10A and 10B are schematic views illustrating a probe in accordance with a third embodiment of the present invention.
Figure 10B:
Figure 11:
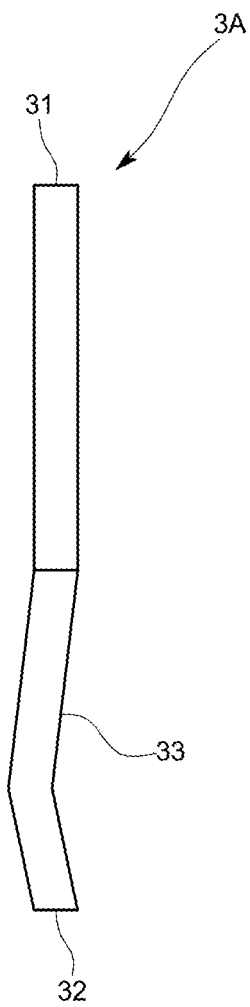
FIG. 11 is a schematic end view illustrating a thin plate constituting the probe in the third embodiment.

Specifically, as illustrated in FIG. 10A at (a) to (i), the probe 3 is formed by stacking nine thin plates 3A. The probe 3 in the stacked state is illustrated in FIG. 10B. The spring elements 33 of each thin plate 3A are a thin wire having a rectangular or elliptical cross section, and bent in the thickness direction into a substantially C shape as illustrated in the end view of FIG. 11. The spring elements 33 are bent such that the position of the main body 11 substantially corresponds to that of the contacts 32 in the thickness direction in the natural state. Such shape of the spring elements 33 is achieved by press work.

Figure 12:
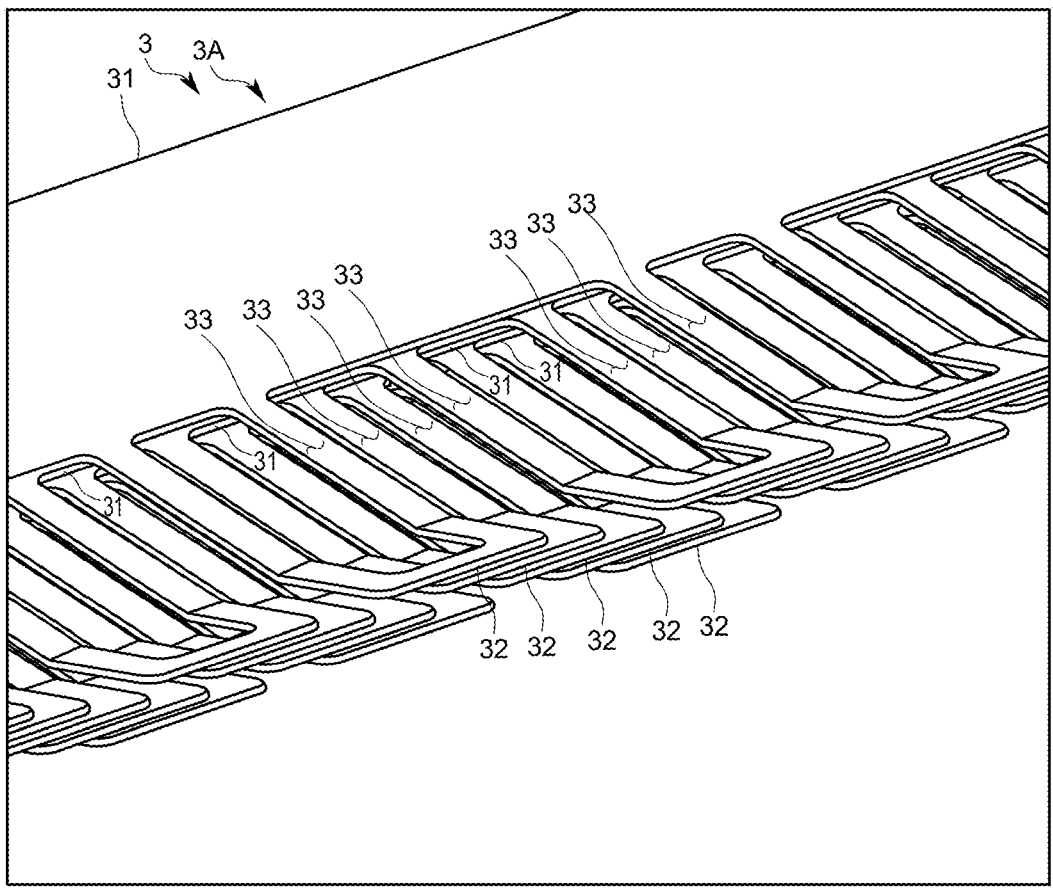
FIG. 12 is a schematic perspective enlarged view illustrating spring elements and contacts of the probe and their surroundings in the third embodiment.

As illustrated in the perspective enlarged view of FIG. 12, the probe 3 formed by stacking the nine thin plates 3A has a cyclic configuration in which five contacts 32 linked in a stepped manner and four contacts linked in a stepped manner are alternately arranged. That is, the bending of the spring elements 33 of each thin plate 3A in the thickness direction is uniform.

The probe 3 thus configured can use the stiffness of the plates to exhibit the resilience of the spring elements 33, achieving a higher durability and a longer lifespan than the spring elements 33 in the first embodiment. In addition, since the stiffness of the plate can be used, the thickness of the thin plate 3A can be reduced and the number of contacts existing in the thickness direction can be increased to increase a probability of contact of the contacts with the finger electrodes F. Therefore, an average effect can further improve the stability of the contact state of each finger electrode F with the probe 3.

Next, a fourth embodiment of the present invention will be described with reference to FIGS. 13A to 17. The same members as those in the first embodiment are given the same reference numerals.

Figure 13A:
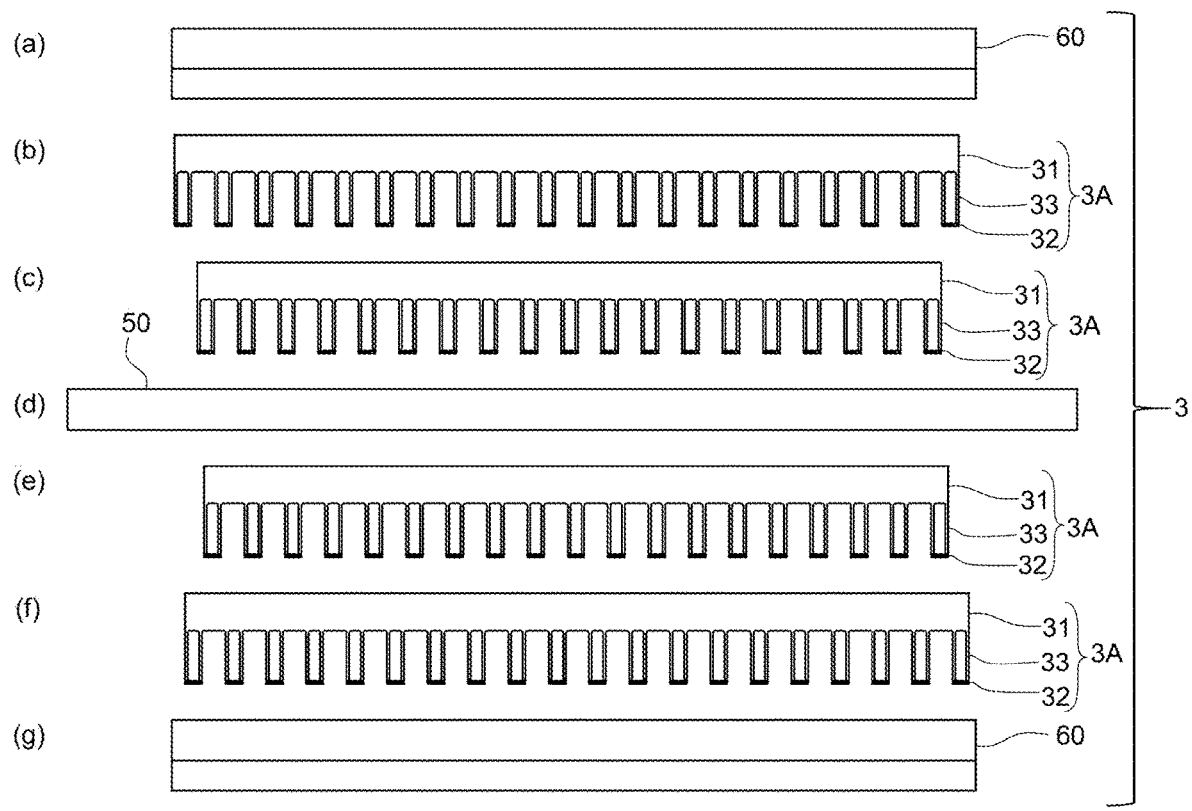
FIGS. 13A and 13B are schematic views illustrating a probe in accordance with a fourth embodiment of the present invention.
Figure 13B:
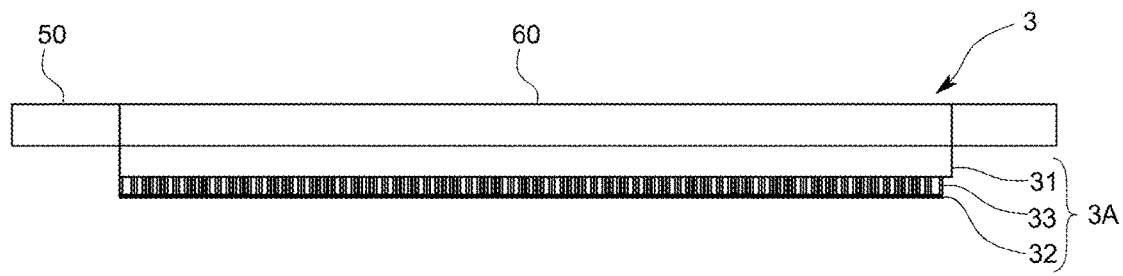
Figure 14:
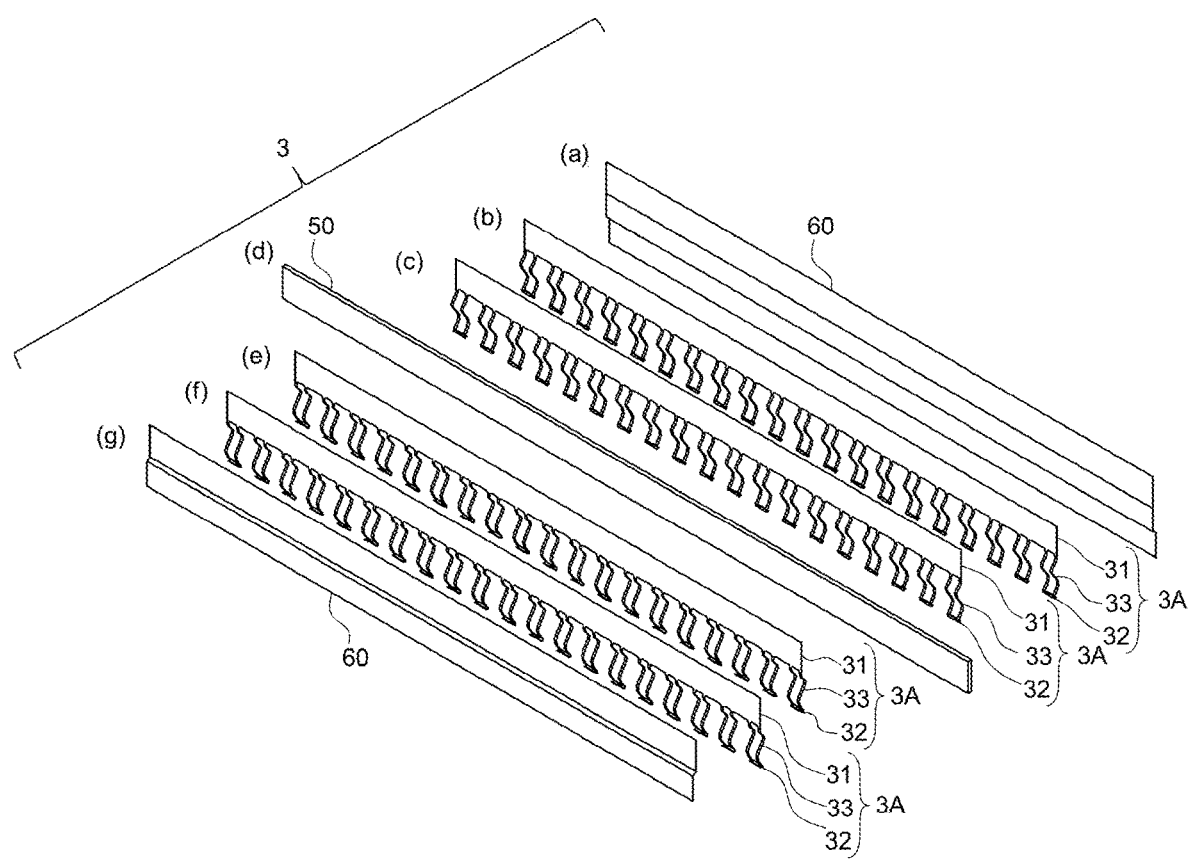
FIG. 14 is a schematic perspective enlarged view illustrating the probe in accordance with the fourth embodiment.

As illustrated in FIGS. 13A, 13B, and 14, in a probe 3 in the fourth embodiment, two pairs of thin plates 3A are disposed on both sides of a spacer plate 50 in a symmetrical manner, and a cover body 60 is provided on the outer side of each pair of the thin plates 3A. These members are stacked in the thickness direction to form the probe 3 illustrated in FIG. 13B.

Each pair of thin plates 3A illustrated in FIGS. 13A and 14 are arranged such that the spring elements 33 and contacts 32 cyclically provided in the thin plates 3A are shifted in phase by almost half cycle as illustrated in FIG. 13A. In addition, the pairs of thin plates 3A are shifted in phase. As a result, when viewing all of the stacked thin plates 3A in the thickness direction, all of the contacts 32 form a straight line as illustrated in FIG. 13B.

Figure 15:
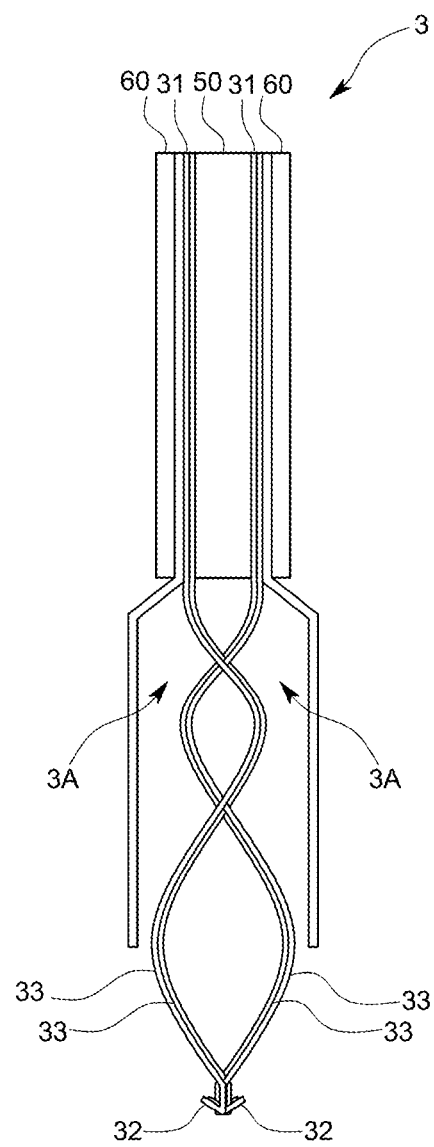
FIG. 15 is a schematic end view illustrating the probe in accordance with the fourth embodiment.
Figure 16:
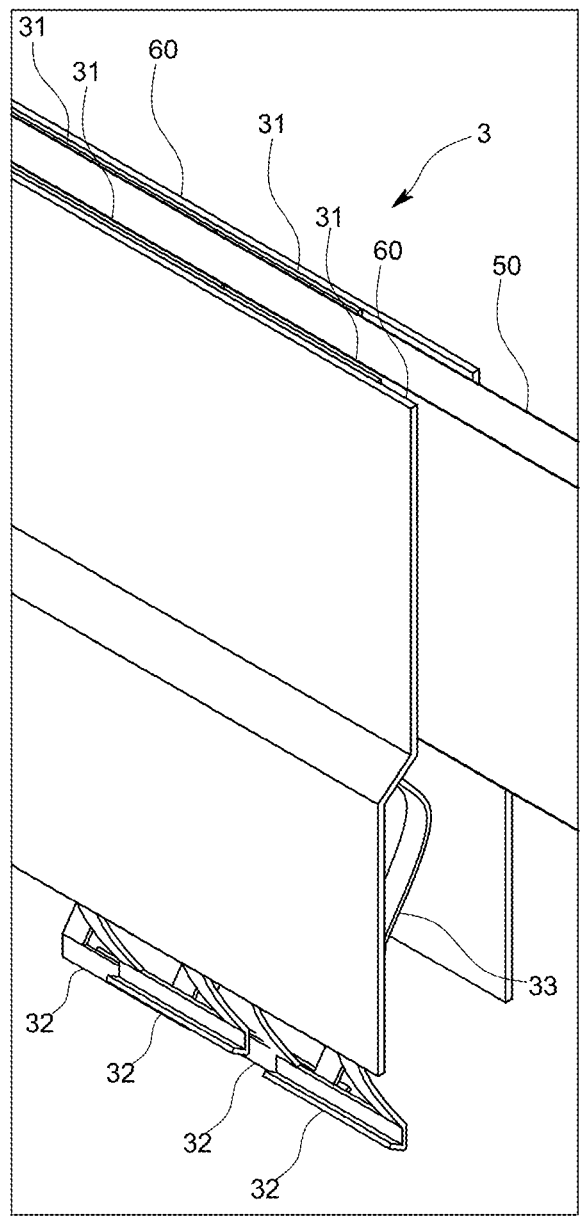
FIG. 16 is a schematic perspective enlarged view illustrating a portion of the probe in accordance with the fourth embodiment.

As illustrated in FIGS. 14 and 15, the probe 3 in this embodiment is different from the probe 3 in third embodiment in that the spring elements 33 are smoothly curved in the thickness direction of the thin plates 3A. That is, the spring elements 33 are disposed also on the outer side of a predetermined plane defined by the main body 31. Further, each spring element 33 has a fold only in one end portion connected to the corresponding contact 32, and is smoothly curved in the remaining portion into an S-shape in the thick direction of the thin plate 3A. The spring elements 33 are curved so as to protrude from the front side and the rear side of the main body 31. In the probe 3 configured of the stacked thin plates 3A, between adjacent spring elements 33 in one thin plate 3A, one or more spring elements 33 in another thin plate 3A are present.

Figure 17:
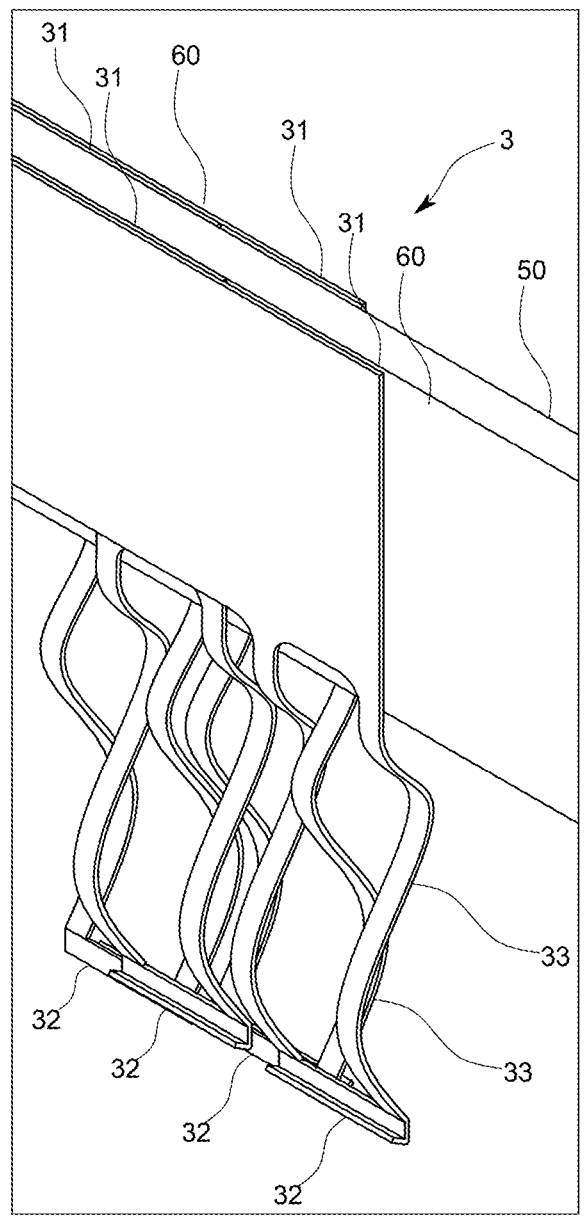
FIG. 17 is a schematic perspective enlarged view illustrating a portion of the probe in accordance with the fourth embodiment, with a cover removed.

As illustrated in FIGS. 15 and 17, each contact 32 is bent into substantially a V-shape, and the contacts 32 make contact with the finger electrodes F at a ridge portion thereof in the natural state where the probe 3 is not pressed onto the solar battery SC, and at the ridge portion or a flat plate portion thereof in the pressed state where the probe 3 is pressed onto the solar battery SC.

The probe 3 thus configured can use the rigidity of the plate to achieve a higher resilience of the spring elements 33 than the spring elements 33 of the probe 3 in the third embodiment, thereby realizing a higher durability and a longer lifespan than the spring elements 33 in the third embodiment.

Other embodiments will be described below.

In the first embodiment, the probe is configured by adhering the main bodies of the plurality of thin plates together. However, the probe may be configured of a single thin plate. In each of the embodiments, the probe is configured of only the stacked thin plates. However, a film-like flexible resin member may be filled in a gap between the spring elements. This can improve the resilience and durability of the spring element. For example, the film-like resin member extending in the longitudinal direction may be formed between the main body and the contacts such that the contacts of each thin plate are exposed to the outside. In this manner, the spring elements and the contacts of each thin plate can be independently moved while improving the resilience and durability.

The shape of the spring element is not limited to the shape described in the first and second embodiments, and any shape may be adopted as long as the spring element can press the contact onto the finger electrodes due to the resilience with a predetermined force at pressing.

The material for the thin plate is not limited to copper alloy, and may be any other suitable conductive material.

The spring elements or the contacts in addition to the main bodies may be adhered to each other to be integrated.

The probe and the solar battery cell measurement apparatus of the present invention may be used for any application other than the measurement of the I-V characteristics of the solar battery cell.

The holder described in the first embodiment is suitable for the probe of the present invention and however, may be used for probes other than the probe of the present invention. For example, the holder may be used for a conventional probe using pins as contacts, the pins being pinched between two plates. Such a holder can eliminate wiring to the probe itself, facilitating the replacement operation.

The contacts of the probe described in the fourth embodiment are bent into substantially V-shapes; however, they may be plate shapes or thin wire shapes extending in the longitudinal direction of the main body as in the first, second, and third embodiments. Such a simplified probe can drive down a manufacturing cost by omitting the bending process.

In each of the embodiments, the probe is used to measure electrical characteristics of the busbar-less solar battery cell. However, the probe of the present invention may be used to measure electrical characteristics of a solar battery cell having a busbar formed orthogonal to each finger electrode. In this case, each contact of the probe may be disposed on the busbar so as not to touch the finger electrodes. That is, the probe of the present invention may be suitably used to measure electrical characteristics of any type of solar battery cell.

Any combination and modification may be made to various embodiments so as not to deviate from the subject matter of the present invention.

INDUSTRIAL APPLICABILITY

The present invention can provide a probe having a higher repeated measurement accuracy and a longer lifespan than is conventional.

The invention claimed is:

1. A probe for measuring an electrical characteristic of a solar battery cell, the probe comprising a plurality of thin plates including a first thin plate and a second thin plate stacked on the first thin plate, the plurality of thin plates being conductors, wherein
the thin plates each include:
an elongated thin plate-shaped main body;
a plurality of contacts that are thin wires, each of the plurality of contacts having two ends, extending in a longitudinal direction parallel to a length of the main body and stacked in a thickness direction of the thin plates, each side surface of the plurality of contacts configured to contact the solar battery cell; and
spring elements, the spring elements being thin wires provided at each end of the plurality of contacts and connecting the main body to the respective contacts, wherein
at least one of the plurality of contacts that is connected to the first thin plate overlaps an adjacent contact that is connected to the second thin plate.

2. The probe according to claim 1, wherein
the spring elements have a portion inclined relative to a direction in which the plurality of contacts are pressed onto the solar battery cell.

3. The probe according to claim 2, wherein the spring elements of each thin plate are bent in the thickness direction of the thin plate.

4. The probe according to claim 2, wherein the spring elements of each thin plate are bent in the longitudinal direction of the main body.

5. The probe according to claim 1, wherein the plurality of thin plates are stacked in the thickness direction.

6. The probe according to claim 1, wherein:
the plurality of contacts are provided at predetermined intervals in the longitudinal direction; and
the plurality of contacts in at least two of the plurality of thin plates are shifted in phase.

7. The probe according to claim 6, wherein a size of each of the plurality of contacts in the longitudinal direction is set to be smaller than twice an interval of a plurality of finger electrodes of the solar battery cell.

8. The probe according to claim 6, wherein
the predetermined intervals are set such that the each of the plurality of contacts makes contact with one or two of a plurality of finger electrodes of the solar battery cell.

9. The probe according to claim 1, wherein:
among the plurality of thin plates stacked in the thickness direction, at least one thin plate is a voltage-measuring thin plate, and a remainder of the thin plates are current-measuring thin plates; and the probe further includes an insulating layer formed between the at least one voltage-measuring thin plate and the current-measuring thin plates.

10. A solar battery cell measurement apparatus comprising:

the probe according to claim 1; and a holder for pinching an end of the main body in the thickness direction and conductively holding the end, in the plurality of thin plates stacked in the thickness direction.

11. The solar battery cell measurement apparatus according to claim 10, wherein:

a first outermost face of the probe is formed of a current-measuring thin plate, and a second outermost face is formed of a voltage-measuring thin plate, of the plurality of thin plates; and the holder includes:

a current acquisition terminal having a receiving face pressed by the main body of the current-measuring thin plate, and a voltage acquisition terminal making contact with the main body of the voltage-measuring thin plate, the voltage acquisition terminal pressing the probe onto the receiving face.

* * * * *